United States Patent
Cyrille et al.

(10) Patent No.: US 7,346,977 B2
(45) Date of Patent: Mar. 25, 2008

(54) METHOD FOR MAKING A MAGNETORESISTIVE READ HEAD HAVING A PINNED LAYER WIDTH GREATER THAN THE FREE LAYER STRIPE HEIGHT

(75) Inventors: Marie-Claire Cyrille, San Jose, CA (US); Meng Ding, Sunnyvale, CA (US); Elizabeth Ann Dobisz, San Jose, CA (US); Kuok San Ho, Santa Clara, CA (US); Scott Arthur MacDonald, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 467 days.

(21) Appl. No.: 11/072,559

(22) Filed: Mar. 3, 2005

(65) Prior Publication Data

US 2006/0196040 A1    Sep. 7, 2006

(51) Int. Cl.
G11B 5/187   (2006.01)
(52) U.S. Cl. .................. 29/603.15; 29/603.16; 29/603.18; 204/192.34; 360/324; 360/324.11; 360/324.12
(58) Field of Classification Search ............ 29/603.12, 29/603.14, 603.15, 603.16, 603.18; 204/192.34; 360/314, 315, 317, 324, 324.11, 324.12
See application file for complete search history.

(56) References Cited

U.S. PATENT DOCUMENTS

| | | | |
|---|---|---|---|
| 5,465,185 A | 11/1995 | Heim et al. | |
| 5,583,725 A | 12/1996 | Coffey et al. | |
| 5,729,410 A | 3/1998 | Fontana et al. | |
| 5,739,988 A * | 4/1998 | Gill | 360/324.12 |
| 6,128,167 A | 10/2000 | Saito et al. | |
| 6,315,875 B1 * | 11/2001 | Sasaki | 204/192.34 |
| 6,400,536 B1 * | 6/2002 | Gill | 360/324.12 |
| 6,519,118 B2 * | 2/2003 | Chang et al. | 360/317 |
| 6,656,604 B2 | 12/2003 | Hasegawa | |

(Continued)

FOREIGN PATENT DOCUMENTS

JP    4-324401    * 11/1992

OTHER PUBLICATIONS

Tanaka et al., "Spin-valve heads in the current-perpendicular-to-plane mode for ultrahigh-density recording", IEEE Transactions on Magnetics, 38 (1): 84-88 Part Jan. 1, 2002.

Primary Examiner—A. Dexter Tugbang
(74) Attorney, Agent, or Firm—Thomas R. Berthold

(57) ABSTRACT

A method for making a magnetoresistive read head so that the pinned ferromagnetic layer is wider than the stripe height of the free ferromagnetic layer uses ion milling with the ion beam aligned at an angle to the substrate supporting the stack of layers making up the read head. The stack is patterned with photoresist to define a rectangular region with front and back long edges aligned parallel to the read head track width. After ion milling in two opposite directions orthogonal to the front and back long edges, the pinned layer width has an extension. The extension makes the width of the pinned layer greater than the stripe height of the free layer after the substrate and stack of layers are lapped. The length of the extension is determined by the angle between the substrate and the ion beam and the thickness of the photoresist.

12 Claims, 10 Drawing Sheets

U.S. PATENT DOCUMENTS

| | | |
|---|---|---|
| 6,690,554 B2 | 2/2004 | Aoki et al. |
| 2001/0038927 A1 | 11/2001 | Hasegawa |
| 2002/0135947 A1 | 9/2002 | Aoki et al. |
| 2003/0011943 A1 | 1/2003 | Webb et al. |
| 2003/0231437 A1 | 12/2003 | Childress et al. |
| 2004/0061979 A1 | 4/2004 | Ho et al. |

* cited by examiner

METHOD FOR MAKING A MAGNETORESISTIVE READ HEAD HAVING A PINNED LAYER WIDTH GREATER THAN THE FREE LAYER STRIPE HEIGHT

BACKGROUND OF THE INVENTION

1. Field of the Invention

The invention relates generally to magnetoresistive sensors or read heads for reading magnetically recorded data, and more particularly to a method for making such heads.

2. Description of the Related Art

In magnetic recording disk drives the conventional sensor for reading the data recorded on the magnetic medium is a magnetoresistive "spin-valve" (SV) read head. The SV read head is a stack of layers that includes two ferromagnetic layers separated by a nonmagnetic electrically-conductive spacer layer. One ferromagnetic layer, typically the bottom ferromagnetic layer closer to the read head substrate, has its magnetization direction fixed or pinned, typically by being exchange coupled with an underlying antiferromagnetic layer. The other ferromagnetic layer is the "sensing" layer that has its magnetization direction "free" to rotate in the presence of the external magnetic field from the recorded data. The free layer is the sensing portion of the read head because when a sense current is applied to the head, the rotation of the free-layer magnetization relative to the pinned-layer magnetization is detected or sensed as a change in electrical resistance. This is because the scattering of the electrons shared by the free and pinned layers is dependent on the orientation of their electron spin relative to the magnetization direction of the layer they penetrate.

The SV magnetoresistive read head used in all current magnetic recording hard disk drives operates with the sense current directed parallel to the planes of the layers in the stack, so it is referred to as a current-in-the-plane (CIP) read head. In a disk drive CIP-SV read head, the magnetization of the pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance.

Magnetoresistive read heads have been proposed that operate with the sense current perpendicular to the planes (CPP) of the layers in the stack. A CPP-SV read head is described by A. Tanaka et al., "Spin-valve heads in the current-perpendicular-to-plane mode for ultrahigh-density recording", *IEEE TRANSACTIONS ON MAGNETICS*, 38 (1):84-88 Part 1 January 2002. Another type of CPP read head is a magnetic tunnel junction (MTJ) read head in which the nonmagnetic spacer layer is a very thin electrically insulating nonmagnetic tunnel barrier. In a MTJ read head the tunneling current perpendicularly through the layers depends on the relative orientation of the magnetizations in the free and pinned layers. While in a MTJ magnetoresistive read head the spacer layer is electrically insulating and is typically alumina ($Al_2O_3$), in a CPP-SV magnetoresistive read head the spacer layer is electrically conductive and is typically copper. A MTJ read head is described in U.S. Pat. No. 5,729,410.

Both CIP and CPP magnetoresistive read heads are formed by successive deposition of the layers on a substrate. The substrate is typically a ceramic or silicon wafer with a layer of electrically insulating material that serves as the first read gap layer if the head is a CIP read head, or with a layer of magnetic material such as permalloy that serves as the first magnetic shield layer if the head is a CPP read head. The stack of layers typically includes a seed layer on the substrate, an antiferromagnetic layer on the seed layer, the pinned ferromagnetic layer on the antiferromagnetic layer, the spacer layer on the pinned layer, the free ferromagnetic layer on the spacer layer and a protective capping layer on the free layer. Following the successive deposition of the layers to form the stack, a series of lithographic patterning and ion milling (or reactive ion etching) steps is performed to define the track width of the read head. The substrate is then lapped along a plane perpendicular to the substrate and parallel to the track width, which then defines the stripe height of the read head. Thus in the completed read head both the free layer and the pinned layer (as well as the underlying antiferromagnetic layer) have the same track width and stripe height dimensions.

One of the problems in magnetoresistive read heads occurs as the heads are made smaller, which is necessary as the track density and areal density of disk drives increase. As the track width and stripe height dimensions of the free layer and thus the pinned layer are decreased, the magnetic stability of the pinned layer is also decreased. The stability of the pinned layer, i.e., its ability to maintain its magnetic moment in the desired pinned direction, decreases with decreasing volume of ferromagnetic material making up the pinned layer. Thus as the track width and stripe height dimensions decrease, the volume of the pinned layer, and thus its magnetic stability, also decreases.

Published patent application US 2003/0231437 A1 describes a CPP read head that has a pinned layer and underlying antiferromagnetic layer with a width greater than the free layer stripe height and a track width greater than the free layer track width. This CPP sensor is manufactured by conventional ion milling of the read head stack followed by selective oxidation of a region of the free layer, with the un-oxidized region of the free layer remaining as the active sensing region.

What is needed is a method for making a magnetoresistive read head that allows the width of the pinned layer and its underlying antiferromagnetic layer to be made larger than the stripe height of the free layer so that the sensing portion of the read head can be reduced without sacrificing the magnetic stability of the pinned layer.

SUMMARY OF THE INVENTION

The invention is a method for making a magnetoresistive read head wherein the pinned layer has a width greater than the stripe height of the free layer. The read head stack of layers on the substrate is patterned with photoresist. The pattern has a rectangular region with front and back long edges. The substrate is located on an adjustable and rotatable platform in a conventional ion beam etching tool and the platform is aligned at an angle to the ion beam and oriented such that the back long edge of the photoresist pattern is orthogonal to the in-plane directional component of the ion beam. The stack of layers is then ion milled down to the spacer layer so that at least a portion of the spacer layer and all the layers in the stack above it are removed in the areas exposed to the incident ions. However, because a section of the stack in the front of the front long edge is protected from the ion beam due to the angle of the ion beam and the thickness of the photoresist, this section retains the spacer layer and the layers above it. After this initial ion milling phase the platform is rotated approximately 180 degrees so that the front long edge is oriented orthogonal to the in-plane directional component of the ion beam. The stack is then ion milled down to the substrate, which is typically an insulating gap layer if the read head is a CIP-SV read head. This second ion milling phase removes the pinned layer and the layers in the stack below it in the areas exposed to the incident ions. Because a section of the stack behind the back long edge is protected from the ion beam due to the angle of the ion beam and the thickness of the photoresist, this section retains the spacer layer and the layers above it. Thus after the subsequent lapping, this section behind the back long edge creates an extension to the pinned layer so that the width of the pinned layer is greater than the stripe height of the free layer by the width of the extension. The pinned layer extension makes the volume of magnetic material in the pinned layer greater than it would be if its width were equal to the stripe height. Thus the method of this invention enables the free layer dimensions to be made smaller without causing magnetic instability in the pinned layer.

For a fuller understanding of the nature and advantages of the present invention, reference should be made to the following detailed description taken together with the accompanying figures.

DETAILED DESCRIPTION OF THE INVENTION

Prior Art

Because this invention relates to the manufacture of magnetoresistive read heads which are used in magnetic recording disk drives, the operation of a conventional disk drive will be briefly described with reference to FIGS. 1-3.

Figure 1:
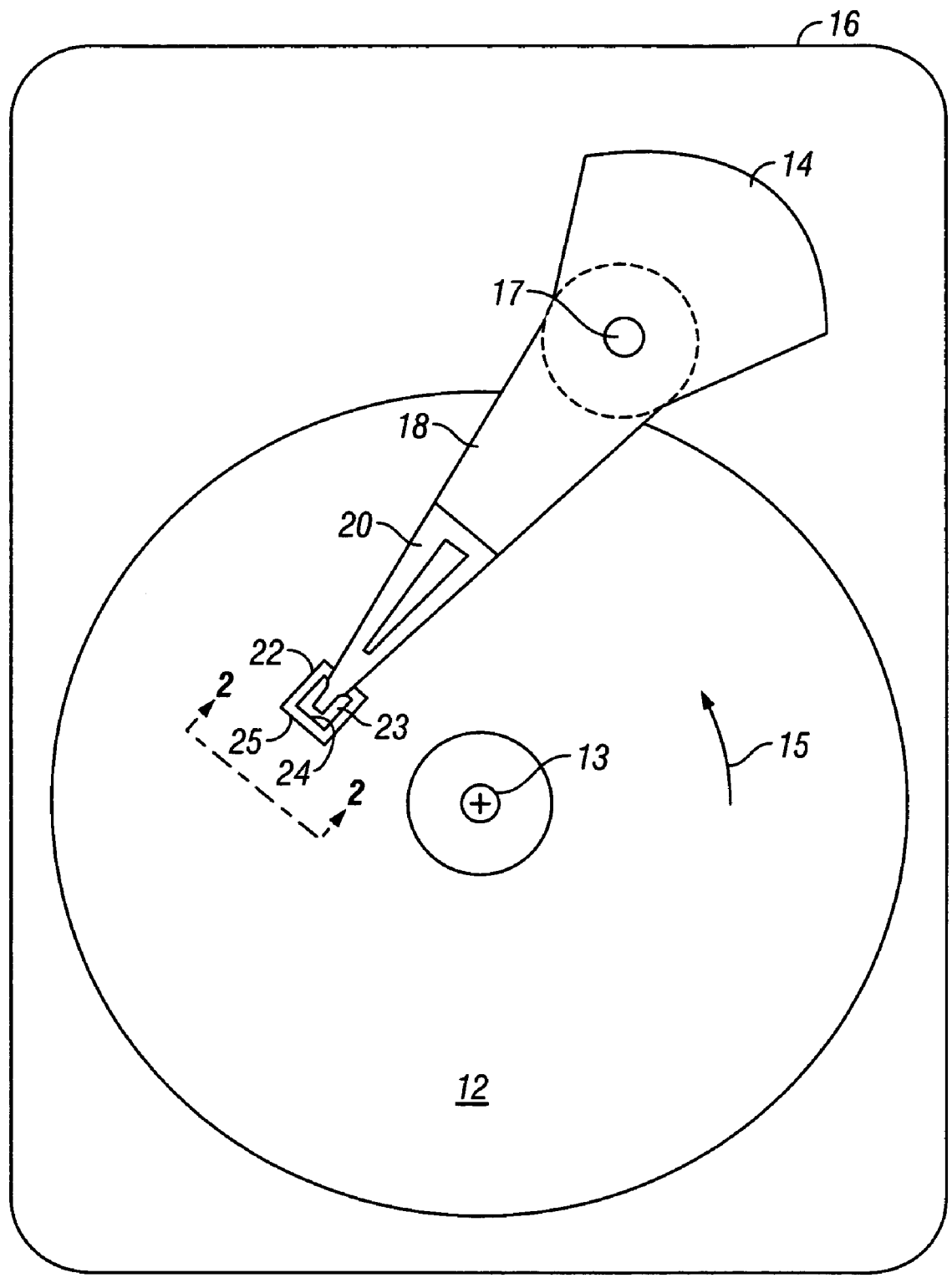
FIG. 1 is a schematic top view of a conventional magnetic recording hard disk drive with the cover removed.

FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
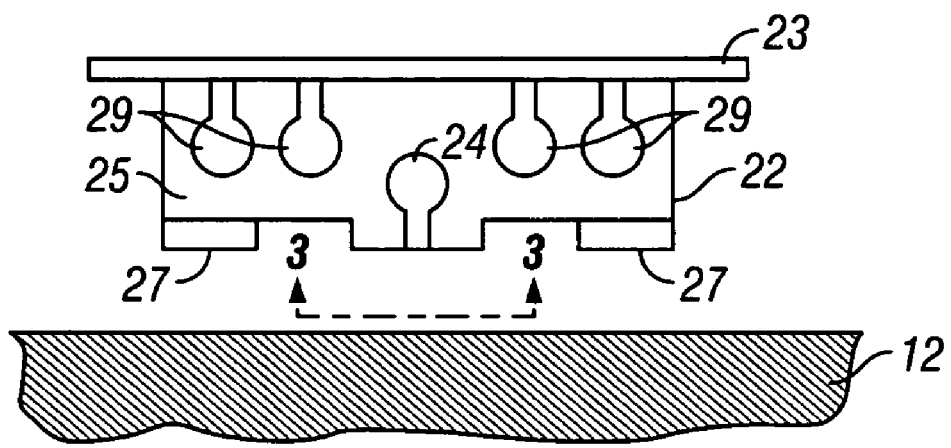
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
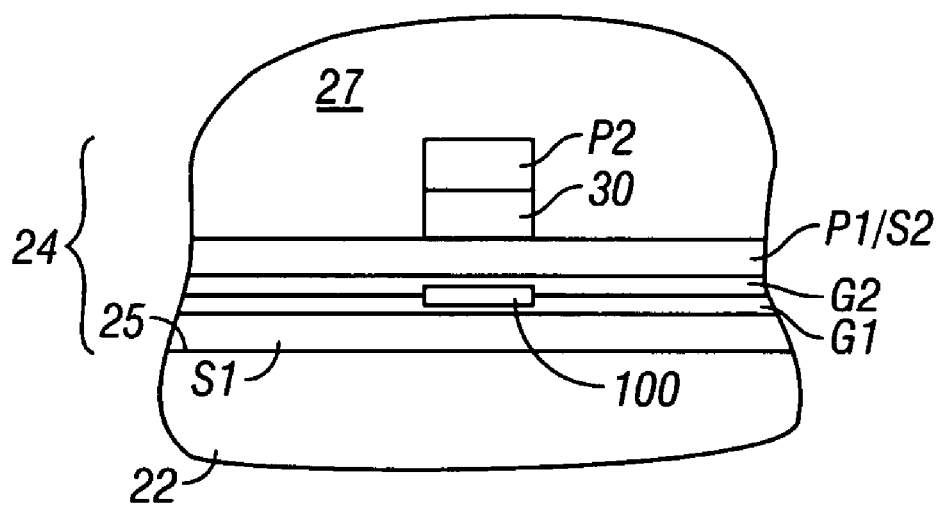
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 on ABS 27 as viewed from the disk 12. The read/write head 24 is a series of thin films deposited and lithographically patterned on slider 22. Slider 22 is typically a wafer of ceramic material, such as a composite of $Al_2O_3$ and TiC, or silicon. The write head includes magnetic write poles P1/S2 and P1 separated by a write gap 30. The magnetoresistive read head 100 depicted is a CIP-SV read head and is thus located between two insulating gap layers G1, G2 that are typically formed of alumina. Gap layers G1, G2 are located between magnetic shields S1 and P1/S2, with P1/S2 also serving as the first write pole for the write head. If the magnetoresistive read head is a CPP read head, like a CPP-SV or MTJ read head that require sense current perpendicular to the planes of the layers, then the read head is formed in contact with the electrically conductive shields S1, S2, or in contact with electrically conducting leads formed on the shields.

Figure 4:
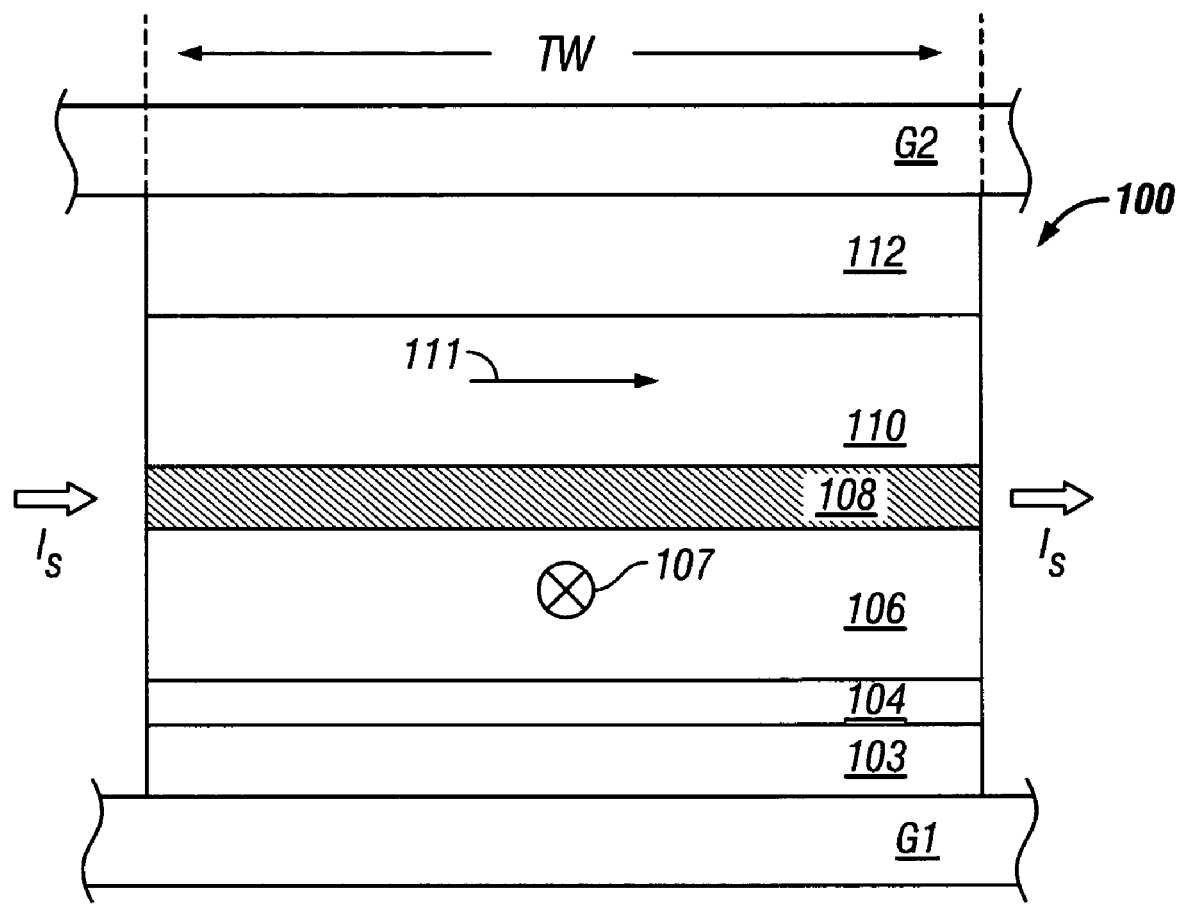
FIG. 4 is a view as seen from the disk of a bottom-pinned CIP-SV read head.

FIG. 4 is an enlarged view of read head 100 as seen from the disk and showing the edges of the layers on the ABS. Read head 100 is a CIP-SV read head comprising a stack of layers formed between the two insulating gap layers G1, G2 that are typically an oxide such as alumina ($Al_2O_3$). The read head layers include a pinned ferromagnetic layer 106 having a fixed magnetic moment or magnetization direction 107 oriented transversely (into the page), a free ferromagnetic layer 110 having a magnetic moment or magnetization direction 111 that can rotate in the plane of layer 110 in response to transverse external magnetic fields, and a nonmagnetic electrically-conductive spacer layer 108 between the pinned layer 106 and free layer 110. Read head 100 is called a "bottom-pinned" CIP-SV read head because the pinned layer 106 is deposited before the free layer 110 and is located beneath the free layer 110. A capping layer, shown as a single capping layer 112 but which can also be a dual capping layer, is formed on top of the free layer 110 before deposition of the insulating gap layer G2. The pinned layer 106 is exchange-coupled with an antiferromagnetic layer 104 that is formed on a suitable underlayer or seed layer 103. Thus the magnetization direction 107 of pinned layer 106 is fixed and will not rotate in the presence of an external magnetic field in the range of interest, i.e., magnetic fields from recorded data on the disk 12. With a sense current Is applied generally in the planes of the free layer 110 and pinned layer 106 from electrical leads (not shown) connected at the edges of the read head, the rotation of the free-layer magnetization 110 relative to the pinned-layer magnetization 107, due to the magnetic fields from the disk, is detectable as a change in electrical resistance. The long edges of free layer 110 and pinned layer 106 parallel to the ABS have a "length" that is the track width (TW) of the read head 100.

While the pinned layer 106 is shown in FIG. 4 as a single layer it can also be the well-known antiparallel-pinned (AP-pinned) structure, also called a "laminated" pinned layer, as described in U.S. Pat. No. 5,465,185. The AP-pinned structure minimizes magnetostatic coupling of the pinned layer 106 with the free layer 110, and comprises a lower ferromagnetic film and an upper ferromagnetic film separated by a nonmagnetic antiferromagnetically-coupling spacer layer such as Ru, with the lower ferromagnetic film being exchange coupled to the antiferromagnetic layer 104. The pinned layer 106 can also be a "self-pinned" laminated structure, as described in U.S. Pat. No. 5,583,725, or a layer of relatively high-coercivity or "hard" magnetic material, such as CoPt, in which case the antiferromagnetic layer 104 is not required.

The seed layer 103 is typically one or more layers of NiFeCr, NiFe, Ta or Ru. The antiferromagnetic layer 104 is a typically a Mn alloy, e.g., PtMn, NiMn, FeMn, IrMn, PdMn, PtPdMn or RhMn. The pinned layer 106 and free layer 110 are typically formed of an alloy of one or more of Co, Fe and Ni, or a bilayer of two alloys, such as a CoFe—NiFe bilayer. The spacer layer 108 is typically formed of copper. The capping layer 112 is typically formed of metal, such as Ta, or an oxide, such as an oxide of Ta or Al. The typical thicknesses for the layers in the stack are 20 to 70 Å for the seed layer, 70 to 200 Å for the antiferromagnetic layer, 10 to 50 Å for the pinned layer, 5 to 30 Å for the spacer layer, 10 to 50 Å for the free layer, and 20 to 70 Å for the capping layer.

Figure 5:
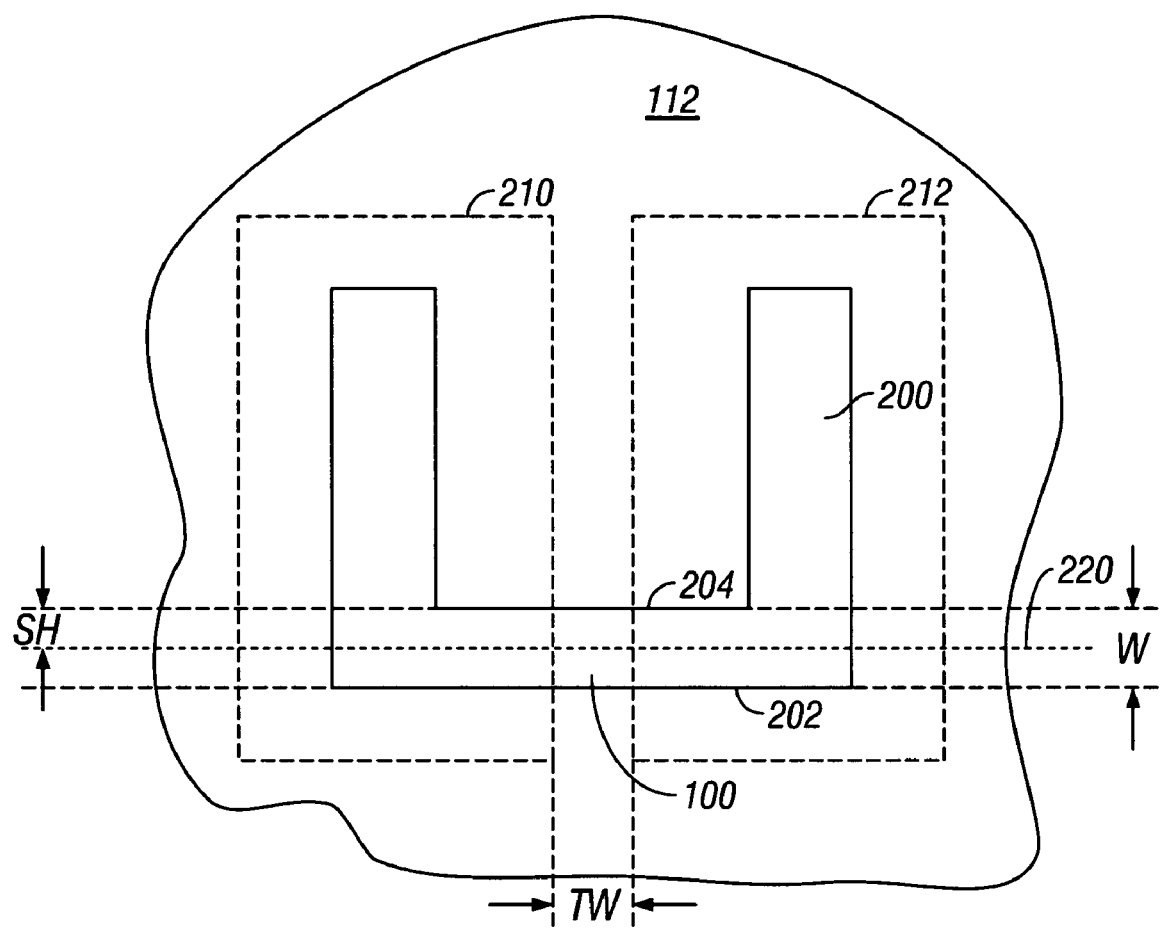
FIG. 5 is a top view of the stack of layers showing a photoresist pattern formed on the stack to illustrate the prior art method of manufacturing the read head.

FIG. 5 is a top view of the stack of layers showing photoresist patterns formed on the stack to illustrate the method of manufacturing the read head 100. A layer of photoresist 200 is patterned on top of the top layer in the stack, capping layer 112. Capping layer 112 and the layers beneath it are generally planar surfaces because they are sequentially deposited on a planar substrate, i.e., the wafer of slider 22 with gap layer G1. The photoresist pattern has a generally rectangular region with a front long edge 202 and a back long edge 204 that define a width W. The stack is then ion milled or etched by reactive ion etching (RIE) with the ion beam being directed perpendicular to the capping layer 112. This removes material not protected by photoresist 200 down to G1. This ion milling step essentially defines the dimension W for the read head 100, which will be later reduced to the stripe height (SH) dimension by lapping. Next, a second lithographic pattern is formed to place photoresist over the structure in the regions outside the rectangular sections 210, 212. A second ion milling or RIE step then removes all of the material inside sections 210, 212. This ion milling step defines the track width (TW) dimension for the read head 100. The substrate and stack of layers are then lapped, typically by a chemical-mechanical polishing (CMP) process, along a plane whose edge 220 is shown. This lapping plane is perpendicular to the substrate and parallel to the front long edge 202 of the first photoresist pattern. After lapping, the read head 100, and thus both the free layer 110 and pinned layer 106 (FIG. 4), has a track width TW and a stripe height SH. As previously described, because this process patterns the free and pinned layers simultaneously to the same dimensions, it is not possible to reduce the dimensions of the free layer without also reducing the dimensions of the pinned layer, thereby making the pinned layer more susceptible to magnetic instability.

The Invention

Figure 6A:
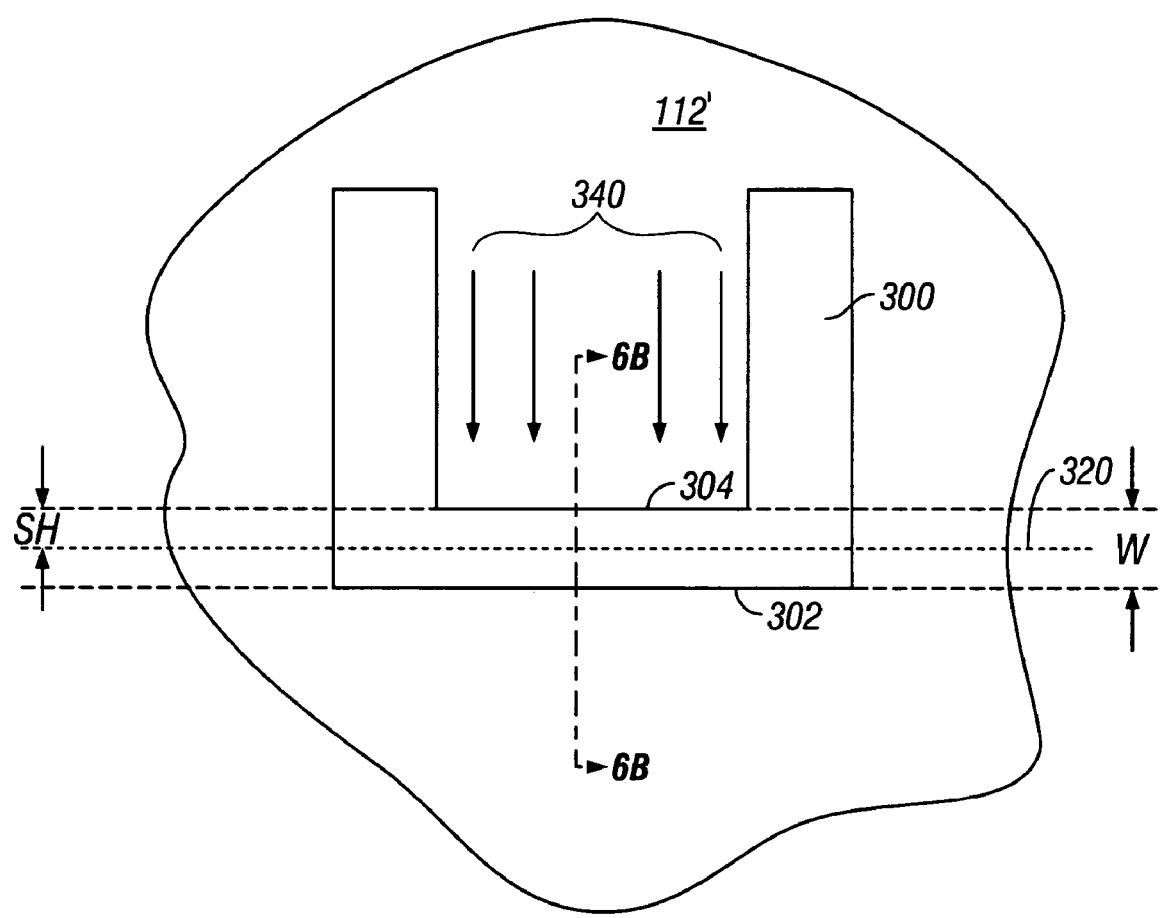
FIG. 6A is a top view of the stack of layers with a photoresist pattern and illustrates the angle between the substrate and the ion beam as part of the method of this invention.

The invention is a method for making a magnetoresistive read head wherein the pinned layer has a width greater than the stripe height of the free layer. FIG. 6A shows a photoresist pattern 300 on capping layer 112', which is the top layer in the read head stack of layers. The pattern 300 has a front long edge 302 and a back long edge 304 that define a width W. Line 320 represents the edge of the subsequent lapping plane.

Figure 6B:
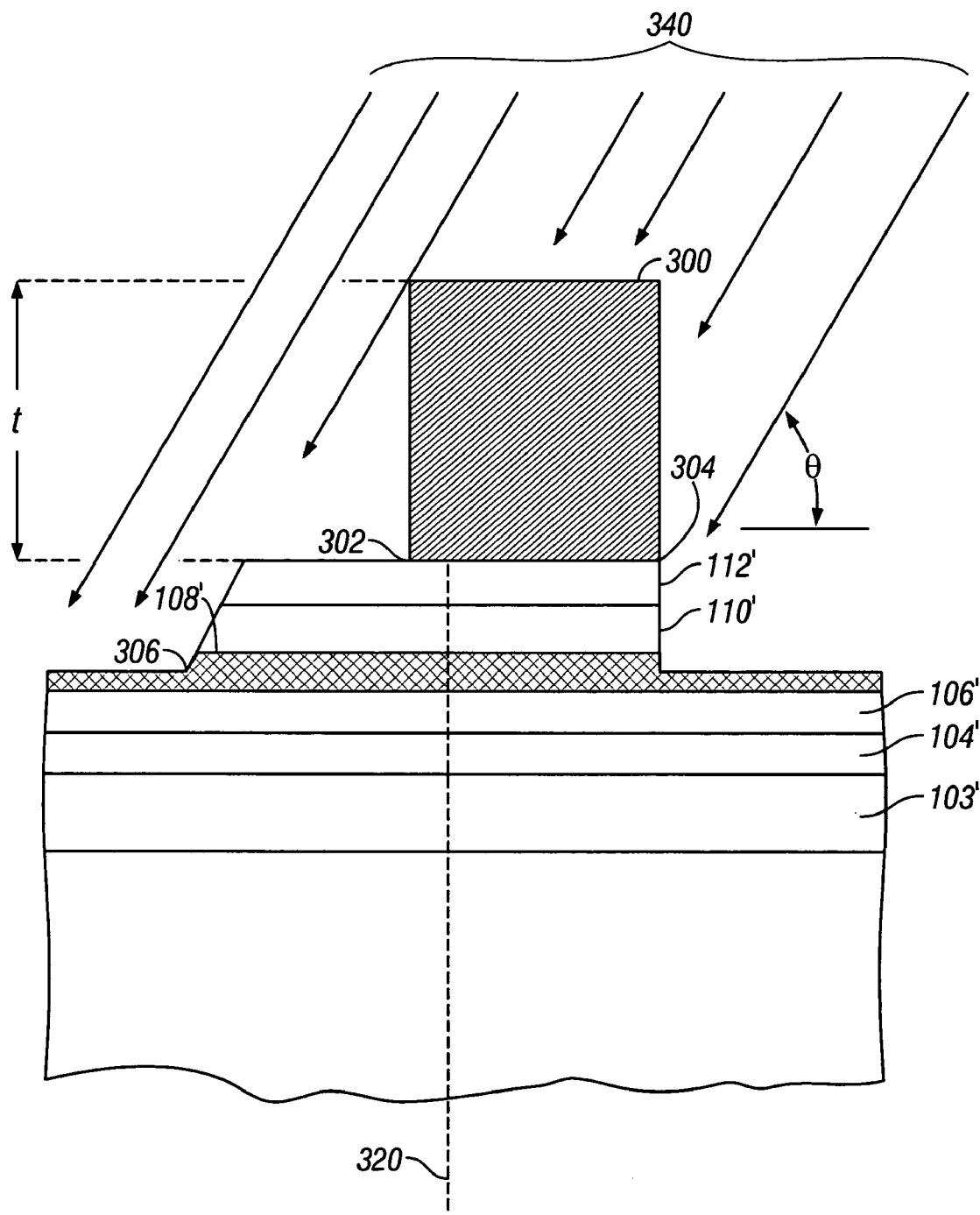
FIG. 6B is a sectional view of section 6B-6B of FIG. 6A showing the angle between the planes of the layers in the stack and the ion beam, and the resulting structure after initial ion milling.

The planar substrate (i.e., the wafer with gap layer G1) with the read head stack of layers formed on it is located on a platform in a conventional ion beam etching tool. The ion beam is typically a beam of Xe or Ar ions. The platform is adjustable such that the plane of the substrate can be aligned at an angle to the incident ion beam. In addition, the platform is rotatable so that the substrate can be swept through the ion beam to assure uniformity in the ion milling. In the method of this invention, the substrate is first aligned at an angle with the potential ion beam and oriented with respect to the direction of the beam. For the purpose of explaining the alignment and orientation, the ion beam can be considered to have two components, a component perpendicular to the plane of the substrate and a component parallel to the plane of the substrate. As shown in FIG. 6A, the substrate is oriented such that the parallel or in-plane component of the ion beam 340 is oriented orthogonal to the back long edge 304 of photoresist pattern 300. FIG. 6B is a sectional view of section 6B-6B of FIG. 6A and shows the angle Θ between the planes of the layers in the stack and the ion beam 340.

Figure 6C:
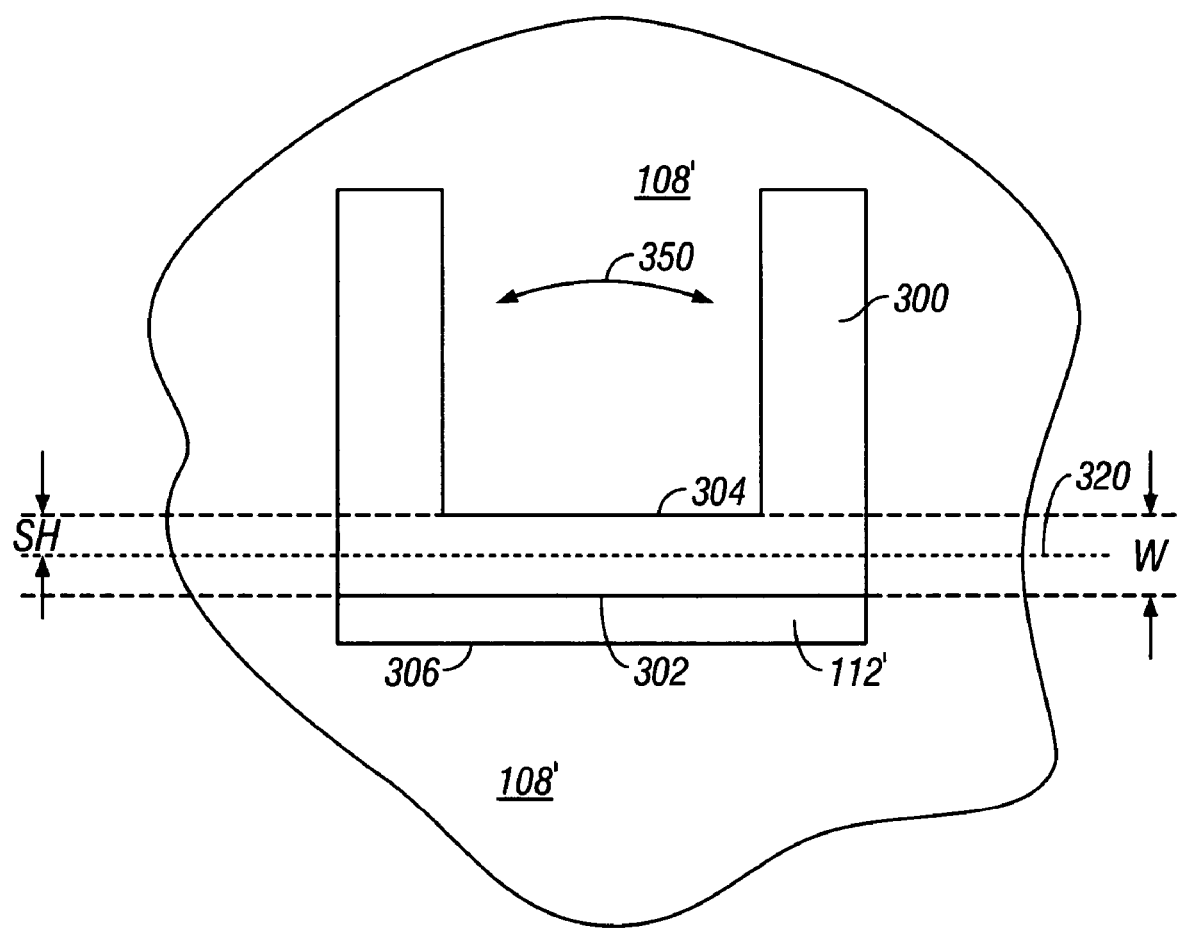
FIG. 6C is a top view of the stack after initial ion milling and shows the section near the front long edge of the photoresist pattern that was not ion milled away.

Referring to FIG. 6B, after the substrate has been so aligned and oriented, the stack of layers is ion milled down to the spacer layer 108'. This removes at least a portion of the spacer layer 108' and all the layers in the stack above the spacer layer that are exposed to the incident ions. The ion milling is stopped at the spacer layer by milling for a predetermined milling time, based on the known previous calibrated milling rate or using secondary ion mass spectroscopy end point detection. For typical thicknesses of the layers in the stack, as previously described, the typical milling time is approximately 3 min. However, because a section of the stack in the front of front long edge 302 and extending out to edge 306 is protected from the ion beam, due to the angle e and the thickness t of the photoresist pattern 300, this section retains the spacer layer and the layers above it. FIG. 6C is a top view of the stack after this initial ion milling phase and shows that in this section between edges 302 and 306 the top layer in the stack is capping layer 112' while in the other areas the top layer is now the spacer layer 108'. During this initial phase of ion milling the ion beam can be swept across the back long edge 304 by rotating the platform back and forth, as shown by the arrow 350 in FIG. 6C. This assures uniformity in the ion milling.

Figure 7A:
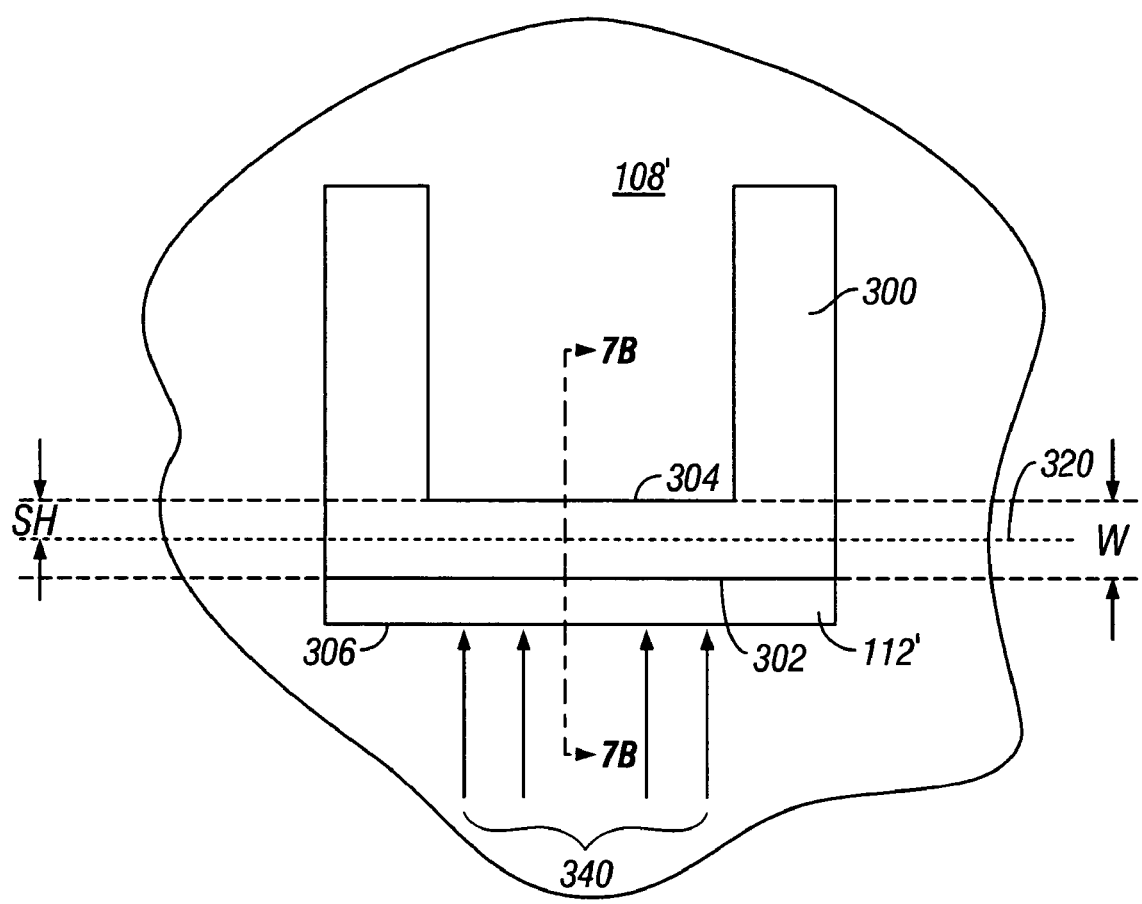
FIG. 7A is a top view of the stack of layers with a photoresist pattern and illustrates the orientation of the ion beam after the substrate has been rotated 180 degrees as part of the method of this invention.
Figure 7B:
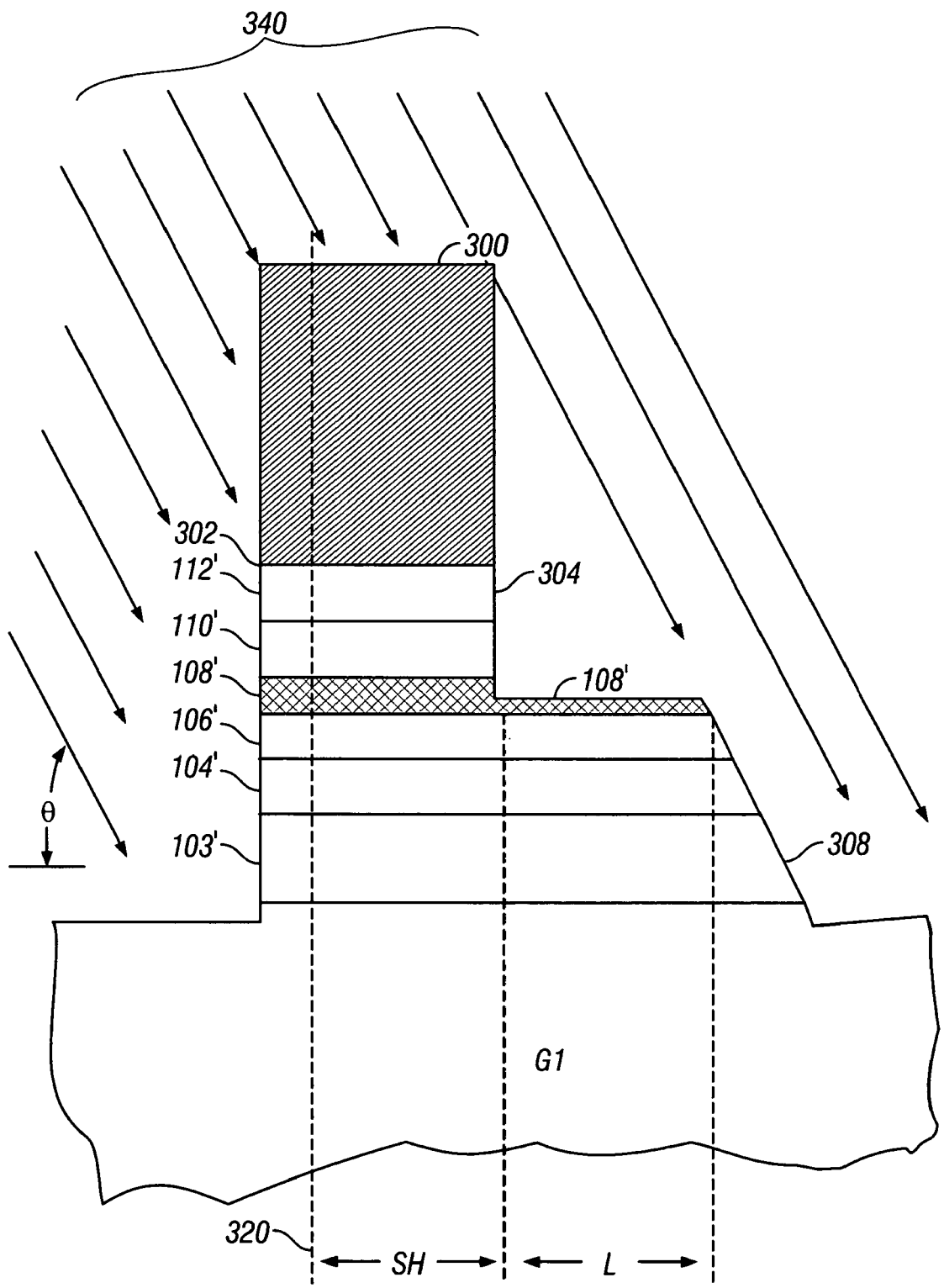
FIG. 7B is a sectional view of section 7B-7B of FIG. 7A showing the angle between the planes of the layers in the stack and the ion beam, and the resulting structure after the second ion milling phase.
Figure 7C:
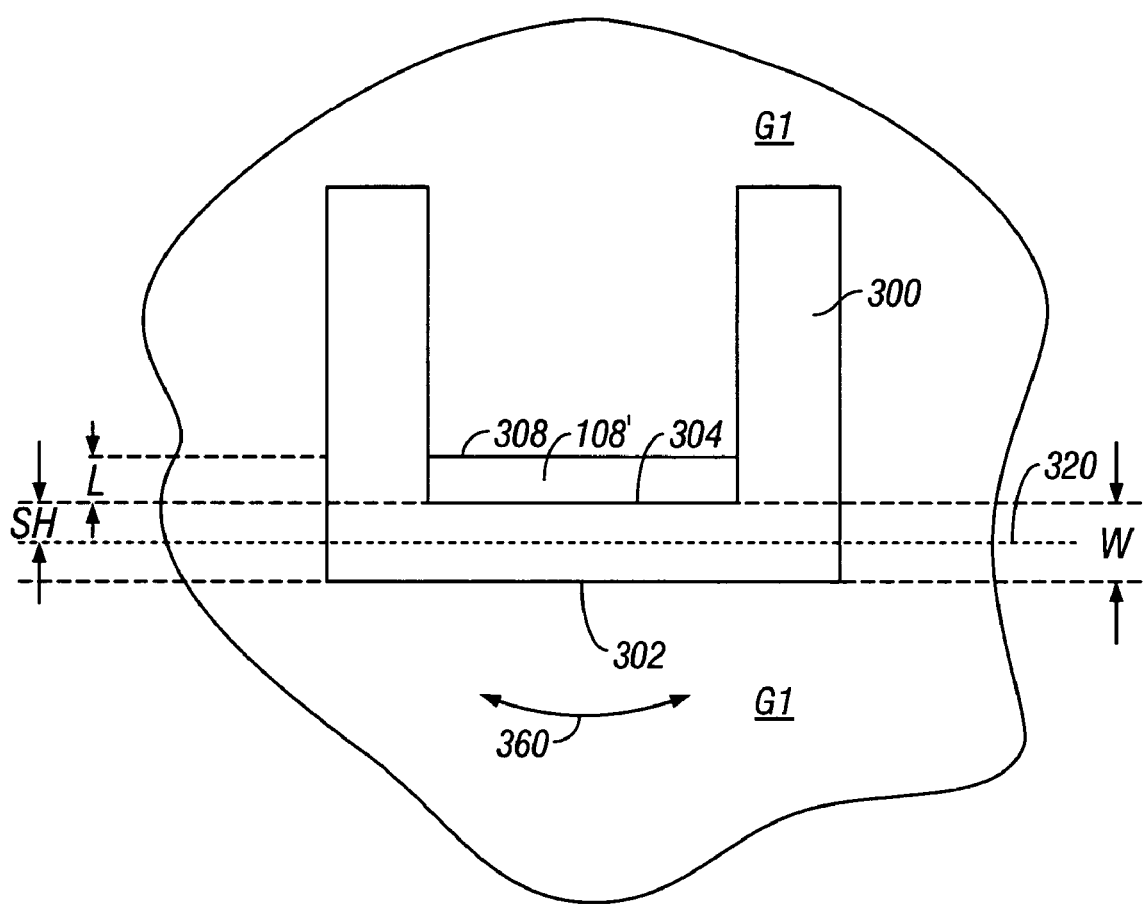
FIG. 7C is a top view of the stack after the second ion milling phase and shows the section near the back long edge of the photoresist pattern forming the extension of the pinned layer that was not ion milled away.

After this initial ion milling phase the platform is rotated approximately 180 degrees so that the front long edge 302 of the photoresist pattern 300 is oriented substantially orthogonal to the parallel or in-plane directional component of the ion beam 340, as shown in FIG. 7A. This rotation can be done with the ion beam on so that the ion milling is essentially a single process step. Alternatively, the ion beam can be turned off after the initial ion milling, the platform rotated 180 degrees, and the ion milling re-started. After the substrate has been so aligned and oriented, as shown in FIG. 7A, the stack of layers is ion milled down to at least the seed layer 103' and preferably down to the gap layer G1, as illustrated in the sectional view of FIG. 7B. This removes the antiferromagnetic layer 104' and the layers in the stack above it, including pinned layer 106', in the areas exposed to the incident ions. The ion milling is stopped at the gap layer G1 by milling for a predetermined milling time. It is not necessary that all of the material above G1 at the front of the sensor also be removed during this ion milling step so long as the material of layer 103' and the layers above it are removed at the back of the sensor to define the extension L. This is because the subsequent lapping along plane 320 will remove the material at the front of the sensor. Because a section of the stack behind the back long edge 304 and extending out to edge 308 is protected from the ion beam, due to the angle Θ and the thickness t of the photoresist pattern 300, this section retains the spacer layer 108' and the layers below it. Thus after the subsequent lapping along plane 320, the section between edges 304 and 308 creates an extension L on the pinned layer 106' and underlying antiferromagnetic layer 104' so that the width of the pinned layer is greater than stripe height SH of free layer 110'. FIG. 7C is a top view of the stack after this second ion milling phase and shows that in this section between edges 304 and 308 the top layer in the stack is now spacer layer 108' while in the other areas the top layer is now the gap layer G1. During this ion milling phase the ion beam can be swept across the front long edge 302 by rotating the platform back and forth, as shown by the arrow 360 in FIG. 7C. This assures uniformity in the ion milling.

The extension L is determined primarily by the thickness t of the photoresist and the angle Θ between the ion beam and the substrate. In one example, if the free layer is to have a stripe height SH of approximately 100 nm, then L can be made to be approximately 40 nm by use of a photoresist of thickness t of approximately 100 nm and an angle Θ of approximately 20 degrees. The extension L makes the volume of magnetic material in the pinned layer greater than it would be if its width were equal to SH. Thus the method of this invention enables the free layer dimensions to be made smaller without causing magnetic instability in the pinned layer.

The method has been described for making a CIP-SV magnetoresistive read head, but the method is fully applicable to making CPP magnetoresistive read heads. The CPP stack of layers would be formed directly on the bottom shield layer S1 or on an electrically conductive lead layer, instead of on the electrically insulating bottom gap layer G1. Also, if the method were used to make a MTJ magnetoresistive read head, the spacer layer would be formed of an electrically insulating tunnel barrier material, such as alumina ($Al_2O_3$) or magnesium oxide (MgO), instead of an electrically conducting material, such as copper.

While the method has been described for a single-layer pinned layer exchange coupled to an underlying antiferromagnetic layer, the method is fully applicable to read heads that have other types of pinned layers, such as those previously described. Thus the pinned layer may be an AP-pinned structure with its lower ferromagnetic film exchange coupled to an underlying antiferromagnetic layer, a "self-pinned" laminated structure that does not require an antiferromagnetic layer, or a layer of relatively high-coercivity or "hard" magnetic material that does not require an antiferromagnetic layer.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a magnetoresistive sensor, the sensor being a read head for reading data from data tracks of a magnetic recording medium and the read head having a track width and a stripe height orthogonal to the track width, the method comprising:
    providing a generally planar substrate;
    providing on the substrate a plurality of sensor layers including a first ferromagnetic layer, a spacer layer on the first ferromagnetic layer and a second ferromagnetic layer on the spacer layer;
    forming a patterned layer of photoresist over the sensor layers, said patterned layer including a generally rectangular region having first and second long edges defining a rectangular region width;
    aligning a potential ion beam at an angle to the substrate with the photoresist pattern being oriented with one of the first and second rectangular region long edges being generally orthogonal to and facing an in-plane directional component of the potential ion beam;
    ion milling the sensor layers to remove, in the area exposed to the ions, at least a portion of the spacer layer and the sensor layers above the spacer layer;
    orienting the photoresist pattern with the other of the first and second rectangular region long edges being generally orthogonal to and facing an in-plane directional component of the ion beam; and
    ion milling the sensor layers to remove, in the area exposed to the ions, substantially all of the first ferromagnetic layer and the sensor layers below the first ferromagnetic layer;
    wherein, after ion milling, the stripe height is defined by lapping the substrate and sensor layers in a plane substantially parallel to the track width and perpendicular to the substrate; and wherein the thickness of the photoresist layer and the angle between the ion beam and the substrate substantially define the width of the first ferromagnetic layer to be wider than said stripe height.

2. The method of claim 1 wherein the spacer layer is formed of an electrically conducting material.

3. The method of claim 1 wherein the spacer layer is formed of an electrically insulating material.

4. The method of claim 1 wherein the first ferromagnetic layer further comprises an antiparallel-pinned structure comprising a lower ferromagnetic film, an antiferromagnetically coupling film on the lower ferromagnetic film, and an upper ferromagnetic film on the coupling film.

5. The method of claim 1 wherein the sensor layers include an antiferromagnetic layer beneath and in contact with the first ferromagnetic layer.

6. The method of claim 5 wherein ion milling the sensor layers beneath the photoresist pattern to remove substantially all of the first ferromagnetic layer comprises ion milling to remove substantially all of said antiferromagnetic layer and the sensor layers below said antiferromagnetic layer.

7. The method of claim 1 wherein the sensor layers include a capping layer over the second ferromagnetic layer.

8. The method of claim 1 wherein ion milling the sensor layers to remove at least a portion of the spacer layer includes sweeping the ion beam across said one long edge.

9. The method of claim 1 wherein ion milling the sensor layers to remove the first ferromagnetic layer includes sweeping the ion beam across said other long edge.

10. The method of claim 1 wherein the first long edge of the rectangular region is the front long edge closer to the lapping plane and the second long edge of the rectangular region is the back long edge farther from the lapping plane; wherein aligning the ion beam comprises first aligning the beam with the back long edge facing the beam; and wherein orienting the photoresist pattern comprises thereafter orienting with the front long edge facing the beam; whereby, after ion milling and lapping, the first ferromagnetic layer has a width that extends from the lapping plane beyond the back long edge.

11. The method of claim 1 wherein the read head is located between electrically insulating gap layers and wherein the substrate comprises a gap layer.

12. The method of claim 1 wherein the read head is located between electrically conducting magnetic shield layers and wherein the substrate comprises a shield layer.

* * * * *